(12) United States Patent
Fukunaga et al.

(10) Patent No.: US 7,972,952 B2
(45) Date of Patent: Jul. 5, 2011

(54) COMPOUND SEMICONDUCTOR LIGHT-EMITTING DEVICE AND METHOD FOR MANUFACTURING THE SAME

(75) Inventors: Naoki Fukunaga, Ichihara (JP); Hironao Shinohara, Ichihara (JP)

(73) Assignee: Showa Denko K.K., Tokoy (JP)

( * ) Notice: Subject to any disclaimer, the term of this patent is extended or adjusted under 35 U.S.C. 154(b) by 0 days.

(21) Appl. No.: 12/095,175

(22) PCT Filed: Dec. 6, 2007

(86) PCT No.: PCT/JP2007/073989
§ 371 (c)(1),
(2), (4) Date: May 28, 2008

(87) PCT Pub. No.: WO2008/072681
PCT Pub. Date: Jun. 19, 2008

(65) Prior Publication Data
US 2009/0267109 A1    Oct. 29, 2009

(30) Foreign Application Priority Data

Dec. 11, 2006    (JP) ................................. 2006-333582

(51) Int. Cl.
*H01L 33/00* (2010.01)
(52) U.S. Cl. ... 438/609; 438/98; 257/749; 257/E31.126; 257/E33.064; 257/98
(58) Field of Classification Search ............ 438/609
See application file for complete search history.

(56) References Cited

U.S. PATENT DOCUMENTS

| 6,669,830 | B1 | 12/2003 | Inoue et al. | |
| 7,141,186 | B2* | 11/2006 | Abe et al. | 252/520.2 |
| 2006/0202227 | A1 | 9/2006 | Kim et al. | |
| 2007/0170434 | A1 | 7/2007 | Inoue et al. | |
| 2007/0241321 | A1* | 10/2007 | Kuo et al. | 257/13 |

FOREIGN PATENT DOCUMENTS

| EP | 1 233 082 A1 | 8/2002 |
| JP | 2000-128698 A | 5/2000 |
| JP | 2005-317676 A | 11/2005 |
| JP | 2006-128227 A | 5/2006 |
| JP | 2006-245524 A | 9/2006 |
| WO | 01/38599 A1 | 5/2001 |
| WO | 2005/086180 A1 | 9/2005 |
| WO | 2005-106974 A1 | 11/2005 |

OTHER PUBLICATIONS

Yagioglu et al, Applied Physics Letters 86, 261908, (Jun. 23, 2005) "Crystallization ... air".*

* cited by examiner

*Primary Examiner* — Jerome Jackson, Jr.
(74) *Attorney, Agent, or Firm* — Sughrue Mion, PLLC

(57) ABSTRACT

A compound semiconductor light-emitting device which includes an n-type semiconductor layer, a light-emitting layer and a p-type semiconductor layer, that are made of a compound semiconductor, formed on a substrate, the n-type semiconductor layer and the p-type semiconductor layer are stacked so as to interpose the light-emitting layer therebetween, a first conductive transparent electrode and a second conductive electrode. The first conductive transparent electrode is made of an IZO film containing an $In_2O_3$ crystal having a bixbyite structure. Also discussed is a method of manufacturing the device.

3 Claims, 6 Drawing Sheets

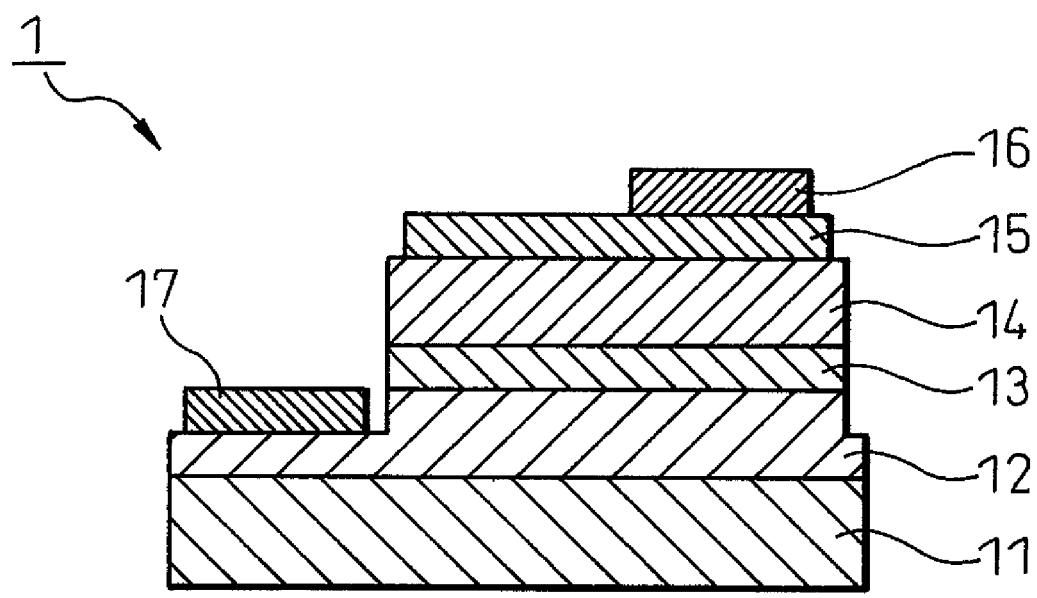

Fig. 3
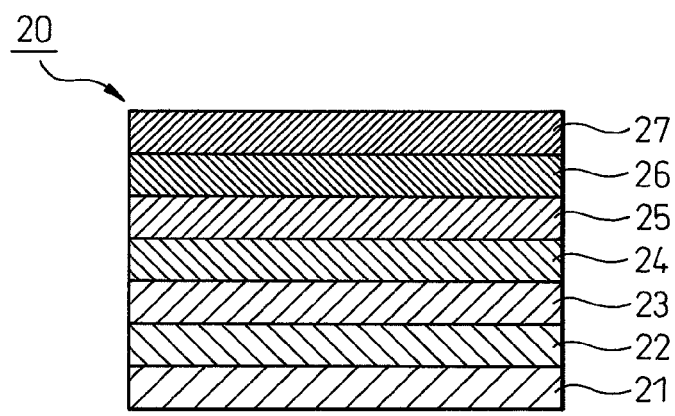
Fig. 4
(a) 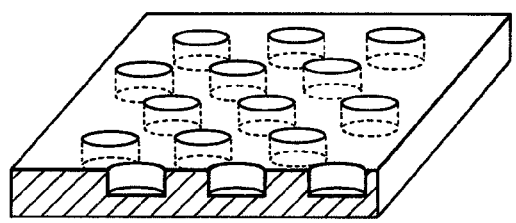   (b) 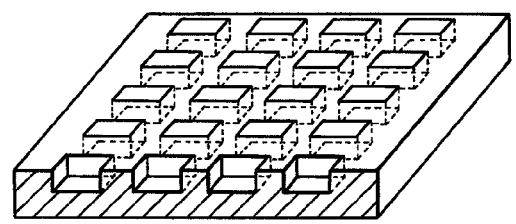

COMPOUND SEMICONDUCTOR LIGHT-EMITTING DEVICE AND METHOD FOR MANUFACTURING THE SAME

TECHNICAL FIELD

The present invention relates to a compound semiconductor light-emitting device, particularly a gallium nitride-based compound semiconductor light-emitting device, and also relates to a compound semiconductor light-emitting device having high light emission output and a method for manufacturing the same.

BACKGROUND ART

A pn-junction type light-emitting diode (LED) is known as one example of a compound semiconductor light-emitting device. For example, a GaP-based LED is known, in which a GaP layer formed by epitaxial growth of a gallium phosphide (GaP) single crystal on a substrate is used as a light-emitting layer. A red range and orange to green range LED comprising an aluminum gallium arsenide mixed crystal (composition formula: $Al_XGa_YAs$ ($0 \leq X, Y \leq 1$ and $X+Y=1$) or an aluminum gallium indium phosphide mixed crystal (composition formula: $Al_XGa_YIn_ZP$ ($0 \leq X,Y,Z \leq 1$, $X+Y+Z=1$) as a light-emitting layer is also known. A short wavelength (near ultraviolet, blue or green range) LED comprising a gallium nitride-based compound semiconductor layer such as gallium indium nitride (composition formula: $Ga_\alpha In_\beta N$ ($0 \leq \alpha, \beta \leq 1$ and $\alpha+\beta=1$) as a light-emitting layer is also known.

In the above $Al_XGa_YIn_ZP$-based LED, a conductive n-type or p-type light-emitting layer is formed on a substrate as a conductive p-type or n-type gallium arsenide (GaAs) single crystal. In a blue LED, a single crystal of electrically insulating sapphire ($\alpha$-$Al_2O_3$ single crystal) is used as the substrate. In a short wavelength LED, silicon carbide (SiC) of a cubic crystal (3C crystal type) or hexagonal crystal (4H or 6H crystal type) is used as the substrate. On a semiconductor wafer in which a semiconductor layer is stacked on these substrates, for example, a first conductive transparent electrode and a second conductive electrode are provided to form a light-emitting device.

Particularly, in the case of a gallium nitride-based compound semiconductor light-emitting device, a gallium nitride-based compound semiconductor light-emitting device is formed by forming a layer on substrates made of various oxides or Group III-V compounds, including a sapphire single crystal, using a metal organic chemical vapor deposition (MOCVD) method or a molecular beam epitaxy (MBE) method.

The feature of the gallium nitride-based compound semiconductor light-emitting device is that it barely diffuses current in the longitudinal direction. Therefore, electric current is injected only into a semiconductor directly under an electrode, and light emitted in the light-emitting layer is not extracted to the outside since the light is blocked by the electrode. In the gallium nitride-based compound semiconductor light-emitting device, a transparent electrode is usually used as a positive electrode, and thus light is extracted through the positive electrode.

Regarding a transparent electrode, known conductive materials such as Ni/Au and ITO are used. For example, it has been recently proposed in Japanese Unexamined Patent Publication (Kokai) No. 2005-123501, that an oxide-based transparent electrode containing $In_2O_3$ or ZnO as the main component is used, since it is excellent in transparency. In the case of an ITO which is generally used as the transparent electrode, a conductive oxide film having low resistivity of $2 \times 10^{-4}$ $\Omega$cm or less can be obtained by doping $In_2O_3$ with 5 to 20% by mass of $SnO_2$.

For example, it has been proposed in Japanese Unexamined Patent Publication (Kokai) No. 2000-196152, that the light extracting surface is subjected to uneven working so as to improve light extraction efficiency. An ITO having low resistance forms a fine crystal immediately after forming a film, and it is necessary to use an etching solution such as an aqueous ferric chloride ($FeCl_3$) solution or hydrochloric acid (HCl) to subject ITO to uneven working. In wet etching using such a strong acid, etching takes place at a high rate, and thus it is difficult to control and burrs are easily generated at the edge portion of the ITO. Further, overetching easily occurs, resulting in poor yield.

The IZO conductive film described in Japanese Unexamined Patent Publication (Kokai) No. 08-217578 can be used to solve the above problems. The IZO film formed by a sputtering method is amorphous, and thus etching can be performed slowly without using the above strong acid. Therefore, burrs caused by etching and overetching do not easily occur. Furthermore, detailed processing for improvement of the output of a light-emitting device can be easily carried out.

However, the amorphous IZO film is inferior in transparency compared with the heat-treated ITO film, and therefore shows low output of the light-emitting device. Furthermore, there is a problem that the device has high drive voltage, since contact resistance with a p-type GaN layer is high, and the device is inferior in water resistance and chemical resistance, since it is amorphous, which results in a decrease in manufacturing yield after forming the ITO film and reliability of the device.

DISCLOSURE OF THE INVENTION

In light of the above problems, the present invention has been made and an object thereof is to provide a compound semiconductor light-emitting device that is excellent in manufacturing yield, and has high light emission output, and a method for manufacturing the same.

The present inventors have conducted intensive studies in order to achieve the above object, and thus the present invention has been accomplished.

The present invention provides the inventions described below.

(1) A compound semiconductor light-emitting device comprising an n-type semiconductor layer, a light-emitting layer and a p-type semiconductor layer, that are made of a compound semiconductor, formed on a substrate, the n-type semiconductor layer and the p-type semiconductor layer being stacked so as to interpose the light-emitting layer therebetween, a first conductive transparent electrode and a second conductive electrode, wherein the first conductive transparent electrode is made of an IZO film containing an $In_2O_3$ crystal having a bixbyite structure.

(2) The compound semiconductor light-emitting device according to (1) above, wherein the ZnO content in the IZO film is from 1 to 20% by mass.

(3) The compound semiconductor light-emitting device according to (1) or (2) above, wherein the thickness of the IZO film is from 35 nm to 10 μm.

(4) The compound semiconductor light-emitting device according to any one of (1) to (3) above, wherein the surface of the IZO film is uneven.

(5) The compound semiconductor light-emitting device according to (4) above, wherein a plurality of independent recesses is formed on the surface of the IZO film.

(6) The compound semiconductor light-emitting device according to (4) or (5) above, wherein the total area of the recesses accounts for ¼ to ¾ of the entire IZO film.

(7) The compound semiconductor light-emitting device according to any one of (4) to (6) above, wherein the thickness of the IZO film in the recesses accounts for ½ or less of the thickness of the IZO film in a protrusion.

(8) The compound semiconductor light-emitting device according to any one of (1) to (7) above, wherein the compound semiconductor is a gallium nitride-based compound semiconductor.

(9) The compound semiconductor light-emitting device according to (8) above, wherein the n-type semiconductor layer, the light-emitting layer and the p-type semiconductor layer are stacked in this order and the first conductive transparent electrode and the second conductive electrode are respectively provided on the p-type semiconductor layer and the n-type semiconductor layer.

(10) A method for manufacturing a compound semiconductor light-emitting device, which comprises steps (a) to (d) shown below:

(a) a step of manufacturing a semiconductor wafer by stacking an n-type semiconductor layer, a light-emitting layer and a p-type semiconductor layer, that are made of a compound semiconductor, on a substrate, the n-type semiconductor layer and the p-type semiconductor layer being stacked so as to interpose the light-emitting layer therebetween, (b) a step of stacking an amorphous IZO film on the semiconductor wafer, (c) a step of etching the amorphous IZO film, and (d) a step of crystallizing the etched amorphous IZO film.

(11) The method for manufacturing a compound semiconductor light-emitting device according to (10) above, wherein the step of stacking an amorphous IZO film on the semiconductor wafer is performed by a sputtering method.

(12) The method for manufacturing a compound semiconductor light-emitting device according to (10) or (11) above, wherein the step of crystallizing the etched amorphous IZO film is performed by a heat treatment.

(13) The method for manufacturing a compound semiconductor light-emitting device according to (12) above, wherein a temperature of the heat treatment is from 500 to 1,000° C.

(14) The method for manufacturing a compound semiconductor light-emitting device according to (13) above, wherein a temperature of the heat treatment is from 700 to 900° C.

(15) The method for manufacturing a compound semiconductor light-emitting device according to any one of (10) to (14) above, wherein the compound semiconductor is a gallium nitride-based compound.

(16) The method for manufacturing a compound semiconductor light-emitting device according to (15) above, wherein the n-type semiconductor layer, the light-emitting layer and the p-type semiconductor layer are stacked in this order and the amorphous IZO film is stacked on the p-type semiconductor layer.

(17) A compound semiconductor light-emitting device manufactured by the method according to any one of (10) to (16) above.

(18) A transparent electrode for a compound semiconductor light-emitting device, comprising an IZO film containing an $In_2O_3$ crystal having a bixbyite structure.

(19) A lamp comprising the compound semiconductor light-emitting device according to any one of (1) to (9) and (17) above.

(20) An electric device comprising the lamp according to (19) above incorporated therein.

(21) A mechanical device comprising the lamp according to (20) above incorporated therein.

According to the present invention, it is possible to manufacture a compound semiconductor light-emitting device, that shows good yields in the manufacturing process, by using an amorphous IZO film having excellent etching properties. It is also possible to convert an amorphous state into a structure containing a crystal by subjecting the IZO film to a heat treatment (hereinafter referred to as "crystallization"). The crystallized IZO film is excellent in transparency as compared with the amorphous ITO film, and thus a compound semiconductor light-emitting device having high light emission output by crystallizing the IZO film after an etching treatment can be obtained.

BRIEF DESCRIPTION OF THE DRAWINGS

FIG. 1 is a sectional view schematically showing one example of a gallium nitride-based compound semiconductor light-emitting device of the present invention.

FIG. 2 is a plan view schematically showing the gallium nitride-based compound semiconductor light-emitting device shown in FIG. 1.

FIG. 3 is a sectional view schematically showing one example of a gallium nitride-based compound semiconductor wafer.

FIG. 4 is a view schematically showing one example of a recess-type uneven working of the surface of an IZO film.

BEST MODE FOR CARRYING OUT THE INVENTION

Figure 5:
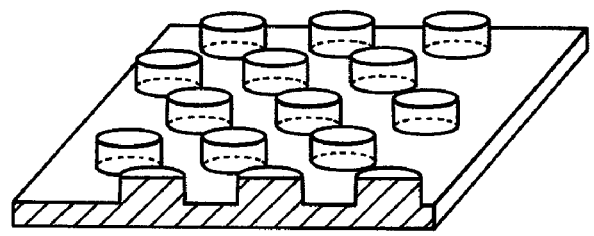
FIG. 5 is a view schematically showing one example of a protrusion-type uneven working of the surface of an IZO film.

A compound semiconductor constituting a light-emitting device includes, for example, a Group III nitride semiconductor layer such as $Al_X Ga_Y In_Z N_{1-a} M_a$ ($0 \leq X \leq 1$, $0 \leq Y \leq 1$, $0 \leq Z \leq 1$ and $X+Y+Z=1$, the symbol M represents a Group V element other than nitrogen, and $0 \leq a < 1$). The compound semiconductor also includes an $Al_X Ga_Y As$ ($0 \leq X$, $Y \leq 1$, $X+Y=1$) layer, an $Al_X Ga_Y In_Z P$ ($0 \leq X,Y,Z \leq 1$, $X+Y+Z=1$) layer, and/or the like formed on a gallium arsenide (GaAs) single crystal substrate. The compound semiconductor also includes a GaP layer formed on a GaP substrate. Particularly, a remarkable effect of the present invention is exerted in the case of a gallium nitride-based semiconductor as a kind of Group III nitride semiconductors in which an amount of current diffusion to a transversal direction is small.

These compound semiconductor layers should be disposed on a substrate at the right position according to the objective function. For example, when a light-emission having a double-hetero conjunction structure is formed, an n-type compound semiconductor layer and a p-type compound semiconductor layer are disposed on both surfaces of a light-emitting layer. Then, a first conductive electrode and a second conductive electrode are disposed at the right position so as to supply a drive current. The present invention is characterized in that a transparent electrode composed of an IZO film containing an $In_2O_3$ crystal having a bixbyite structure is used as the first conductive electrode.

A description will now be made in detail of a gallium nitride-based compound semiconductor light-emitting device, which is one embodiment of a semiconductor light-emitting device of the present invention, as an example with reference to FIG. 1 to FIG. 10. However, the present invention is not limited to the gallium nitride-based compound semiconductor light-emitting device and can be applied to a light-emitting device using the above various compound semiconductors.

FIG. 1 is a sectional view schematically showing one example of a semiconductor light-emitting device of the present invention, and FIG. 2 is a plan view schematically showing the semiconductor light-emitting device shown in FIG. 1.

The semiconductor light-emitting device shown 1 in FIG. 1 is a face-up type light-emitting device, and is generally formed by stacking an n-type semiconductor layer 12, a light-emitting layer 13 and a p-type semiconductor layer 14, which constitute a gallium nitride compound semiconductor layer, on a substrate 11, and stacking a positive electrode 15 (transparent electrode) as a first conductive electrode composed of an IZO film on the p-type semiconductor layer. A positive electrode bonding pad 16 is formed on a portion of the positive electrode 15. Further, a negative electrode 17 of a bonding pad is formed in the range where a second conductive electrode (negative electrode) on the n-type semiconductor layer is formed.

The respective constituent elements of the gallium nitride-based compound semiconductor light-emitting device of the present invention will now be described.

"Substrate"

It is possible to use, as the substrate, known substrate materials, for example, oxide single crystals such as sapphire single crystal ($Al_2O_3$; A-surface, C-surface, M-surface, R-surface), spinel single crystal ($MgAl_2O_4$), ZnO single crystal, $LiAlO_2$ single crystal, $LiGaO_2$ single crystal or MgO single crystal; Si single crystal; SiC single crystal; GaAs single crystal; AlN single crystal; GaN single crystal; and boride single crystals such as $ZrB_2$ without any limitation.

Surface orientation of the substrate is not specifically limited. The substrate may be an on-axis substrate or a substrate provided with an off-angle.

"Gallium Nitride-Based Compound Semiconductor Layer"

As the n-type semiconductor layer 12, the light-emitting layer 13 and p-type semiconductor layer 14, various structures are known, and these known layers can be used without any limitation. It is particularly preferable to use, as the p-type semiconductor layer, those having a general carrier concentration. The positive electrode 15 of the IZO film used in the present invention can be applied even to a p-type semiconductor layer having a comparatively low carrier concentration of, for example, about $1 \times 10^{17}$ cm$^{-3}$.

As the gallium nitride-based compound semiconductor, semiconductors with various compositions represented by $Al_xIn_yGa_{1-x-y}N$ ($0 \leq x < 1$, $0 \leq y < 1$, $0 \leq x+y < 1$) are known. As the gallium nitride-based compound semiconductor constituting the n-type semiconductor layer, the light-emitting layer and p-type semiconductor layer in the present invention, semiconductors with various compositions represented by $Al_xIn_yGa_{1-x-y}N$ ($0 \leq x < 1$, $0 \leq y < 1$, $0 \leq x+y < 1$) can be used without any limitation.

The growth method of these gallium nitride-based compound semiconductors is not specifically limited, and it is possible to use all methods, that are known as the growth method of the gallium nitride-based compound semiconductor, such as an MOCVD (metal organic chemical vapor deposition) method, a HVPE (hydride vapor deposition epitaxy) method and a MBE (molecular beam epitaxy) method. In view of thickness controllability and mass productivity, a preferable growth method is a MOCVD method. In the MOCVD method, hydrogen ($H_2$) or nitrogen ($N_2$) is used as a carrier gas, trimethyl gallium (TMG) or triethyl gallium (TEG) is used as a Ga source, trimethyl aluminum (TMA) or triethyl aluminum (TEA) is used as an Al source, trimethyl indium (TMI) or triethyl indium (TEI) is used as an In source, and ammonia ($NH_3$) or hydrazine ($N_2H_4$) is used as an N source. In the case of the n-type semiconductor, as a dopant, monosilane ($SiH_4$) or disilane ($Si_2H_6$) is used as a Si material and germane ($GeH_4$) or an organogermanium compound is used as a Ge material. In the case of the p-type semiconductor, biscyclopentadienyl magnesium ($Cp_2Mg$) or bisethylcyclopentadienyl magnesium ($(EtCp)_2Mg$) is used as a Mg material.

It is possible to use, as one example of the semiconductor wafer in which such a gallium nitride-based compound semiconductor is stacked on a substrate, a semiconductor wafer in which a buffer layer (not shown) made of AlN is stacked on a substrate 21 made of sapphire and then a GaN underlying layer 22, an n-type GaN contact layer 23, an n-type AlGaN clad layer 24, a light-emitting layer 25 made of InGaN, a p-type AlGaN clad layer 26 and a p-type GaN contact layer 27 are sequentially stacked, like a gallium nitride-based compound semiconductor wafer 20 having a stacked structure as shown in FIG. 3.

"Positive Electrode (IZO Film)"

On the p-type semiconductor layer 14, an IZO film containing an $In_2O_3$ crystal having a bixbyite structure is formed as the positive electrode 15. The IZO film is formed directly above the p-type semiconductor layer, or formed on the p-type semiconductor layer through a metal layer. Although the drive voltage of the light-emitting device can be decreased when the metal layer is interposed between the IZO film and the p-type semiconductor layer, the light transmittance decreases and output decreases. Therefore, it is determined whether or not the metal layer is interposed between the IZO film and the p-type semiconductor layer by controlling balance between the drive voltage and the output according to applications of the light-emitting device. Herein, a layer made of Ni, Ni oxide, Pt, Pd, Ru, Rh, Re or Os is preferably used as the metal layer.

The IZO film preferably has the composition that enables the lowest resistivity. For example, the ZnO concentration in IZO is preferably from 1 to 20% by mass, more preferably from 5 to 15% by mass, and most preferably 10% by mass.

The thickness of the IZO film is preferably within a range from 35 to 10,000 nm (10 µm) that enables low resistivity and high light transmittance. Furthermore, the thickness of the IZO film is preferably 1,000 nm (1 µm) or less in view of manufacturing cost.

The method for formation of the IZO film will now be described by way of examples.

First, an IZO film in an amorphous state is formed on the entire p-type semiconductor layer 14. The method for formation of the IZO film to be used is any known method used for formation of a thin film as long as it is a method capable of forming an IZO film in an amorphous state. For example, the film can be formed using a method such as a sputtering method or a vacuum deposition method, and a sputtering method is preferable, in which very little dust is generated upon film formation as compared with a vacuum deposition method. When using the sputtering method, the film can be formed by revolution deposition of an $In_2O_3$ target and a ZnO target using an RF magnetron sputtering method. The film may be formed by a DC magnetron sputtering method using an IZO target so as to further increase the film formation rate. Discharge output of sputtering is preferably 1,000 W or less so as to reduce damage on the p-type semiconductor layer 14 caused by plasma.

The range excluding the positive electrode formation range where the positive electrode 15 on the p-type semiconductor layer 14 is formed is patterned by using a known photolithography and etching method, resulting in a state in which the amorphous IZO film thus formed is formed only in the positive electrode formation range, as shown in FIG. 2.

Patterning of the IZO film is preferably performed before performing a heat treatment process described hereinafter. It becomes difficult to perform etching as compared with the IZO film in an amorphous state, since the IZO film in an amorphous state is converted into the crystallized IZO film by the heat treatment. In contrast, the IZO film before the heat treatment is in an amorphous state, and thus makes it possible to easily perform etching using a known etching solution. For example, when using an ITO-07N etching solution (manufactured by Kanto Chemical Co., Ltd.), etching can be performed at an etching rate of about 40 nm/min, which results in burr and overetching rarely occurring.

The IZO film in an amorphous state can be etched using a dry etching device, and $Cl_2$, $SiCl_4$ or $BCl_3$ can be used as the etching gas.

The surface of the IZO film in an amorphous state can be unevenly worked using the above photolithograph method and etching method. For example, when using the ITO-07N etching solution, unevenness measuring 40 nm in thickness can be formed by etching for one minute.

The light emission output of the gallium nitride-based compound semiconductor light-emitting device can be improved by uneven working using etching. The reason why improvement of the light emission output due to uneven working is a result of: 1. improvement in light transmittance due to thinning of a transparent electrode, 2. increase in the light taken-out area (surface area of IZO film) due to uneven working, and 3. decrease in total reflection on the surface of a transparent electrode.

For above reasons 1 to 3, the output improving effect is exerted even if the uneven shape is any shape. A dot shape shown in FIG. 4 and FIG. 5 is more preferable, since the area of the uneven side can be increased.

Since the sheet resistance decreases as the thickness of the transparent electrode increases, and the electric current flowing in the electrode easily diffuses into the entire range of the electrode, the transparent electrode preferably may be an uneven shape which enables easy flow of electric current to the protrusions. Therefore, the dot shape is more preferably the shape with independent recesses shown in FIG. 4 is more preferable as compared with the shape with independent protrusions shown in FIG. 5. When the area of the recesses accounts for ¼ or less of the area of the protrusions, light emission output improving effect is small. When the area of the recesses accounts for ¾ or more of the area of the protrusions, the electric current does not easily diffuse and the drive voltage increases. Therefore, the area of the recesses preferably accounts for ¼ to ¾ of the area of the protrusions.

The thickness of the IZO film in the recesses preferably accounts for ½ or less of the thickness of the IZO film in the protrusions so as to increase the amount of light to be taken out from the uneven side. When the IZO film of the recesses is completely etched, namely, when the thickness of the IZO film in the recesses is 0 nm, the output is effectively increased since light can be taken out from the p-type GaN layer without going through the IZO film. It is possible to treat with the same etching time as in patterning of the IZO film, and thus patterning and uneven working of the IZO film can be simultaneously performed and the manufacturing process can be shortened. However, when the IZO film of the recesses is completely etched, the contact area between the IZO film and the p-type semiconductor layer may decrease, resulting in an increase of the drive voltage of the light-emitting device. Therefore, only when the light emission output of the light-emitting device has preference to the drive voltage, an IZO film having a thickness of 0 nm in the recesses may be used.

Similar to the above patterning, a photolithography method can be used without any limitation in uneven working. Furthermore, in order to improve the light emission output, slight unevenness may be formed using a g- or i-line stepper, a nanoinprinting device, a laser exposure device, or an EB (electron beam) exposure device.

Similar to patterning of the IZO film, uneven working of the IZO film is preferably performed before performing the following heat treatment process.

The IZO film in an amorphous state is converted into a crystallized IZO film by performing a heat treatment at a temperature within a range from 500 to 1,000° C. (heat treatment process). Light transmittance at an emission wavelength of the gallium nitride-based compound semiconductor light-emitting device can be improved by converting into the crystallized IZO film. The light transmittance remarkably increases in the wavelength range from 380 to 500 nm. As described above, the crystallized IZO film is not easily etched and therefore the heat treatment is preferably performed after the etching treatment.

The heat treatment of the IZO film is preferably performed in an atmosphere free of $O_2$. The atmosphere free of $O_2$ includes, for example, an inert gas atmosphere such as an $N_2$ gas atmosphere, or a mixed gas atmosphere of an inert gas such as $N_2$ and $H_2$, and an $N_2$ gas atmosphere or a mixed gas atmosphere of $N_2$ and $H_2$ is preferable. As is apparent from the results of Test Example 1 described hereinafter, when the heat treatment of the IZO film is performed in the $N_2$ gas atmosphere or the mixed gas atmosphere of $N_2$ and $H_2$, it is possible to crystallize the IZO film and to effectively decrease the sheet resistance of the IZO film. Particularly, when the sheet resistance of the IZO film is decreased, the heat treatment of the IZO film may be performed in the mixed gas atmosphere of $N_2$ and $H_2$. The mixing ratio of $N_2$ and $H_2$ in the mixed gas atmosphere is preferably from 100:1 to 1:100.

In contrast, when the heat treatment is performed in an atmosphere containing $O_2$, the sheet resistance of the IZO film increases. The reason why the sheet resistance of the IZO film increases when the heat treatment is performed in an atmosphere containing $O_2$ is because oxygen vacancies in the IZO film decrease. The IZO film shows conductivity since electrons serving as a carrier are generated by the presence of oxygen vacancies in the IZO film. It is considered that oxygen vacancies as a resource of generation of carrier electrons decreases as a result of the heat treatment, and thus carrier concentration decreases and sheet resistance increases.

The heat treatment temperature of the IZO film is preferably from 500 to 1,000° C. When the heat treatment is performed at a temperature of less than 500° C., there arises a fear that the IZO film cannot be sufficiently crystallized and the IZO film may not have sufficiently high light transmittance. When the heat treatment is performed at a temperature of higher than 1,000° C., the IZO film is crystallized, but the IZO film may not have sufficiently high light transmittance. When the heat treatment is performed at a temperature of higher than 1,000° C., there is a fear that the semiconductor layer under the IZO film is deteriorated.

When the IZO film in an amorphous state is crystallized, the crystalline structure in the IZO film varies depending on the film formation conditions and heat treatment conditions. For example, as is apparent from the results of X-ray diffraction (XRD) in Test Example 2 described hereinafter, when the heat treatment is performed at a temperature of 700 to 1,000° C., the IZO film contains an $In_2O_3$ crystal having a bixbyite structure. When the IZO film contains an $In_2O_3$ crystal having a bixbyite structure is used as a transparent electrode, the drive voltage of the gallium nitride-based compound semiconductor light-emitting device is lower than that in the case of using the IZO film in an amorphous state. Therefore, the crystallized IZO film preferably contains an $In_2O_3$ crystal having a bixbyite structure. The reason why the drive voltage of the gallium nitride-based compound semiconductor light-emitting device decreases by mixing of the $In_2O_3$ crystal having a bixbyite structure is not clear, but is considered to be since the contact resistance with the p-type semiconductor layer in the contact interface decreases by mixing of the $In_2O_3$ crystal having a bixbyite structure.

The IZO film may be subjected to a heat treatment so as to mix the $In_2O_3$ crystal having a bixbyite structure in the IZO film, and the conditions of the heat treatment vary depending on the film formation method and the composition of the IZO film. For example, the IZO film containing the $In_2O_3$ crystal having a bixbyite structure can be formed by the heat treatment at lower temperature since the crystallization temperature decreases when the zinc (Zn) concentration in the IZO film decreases.

In this embodiment, a heat treatment is employed so as to crystallize the IZO film. In the gallium nitride-based compound semiconductor light-emitting device of the present invention, any method may be used as long as the IZO film can be crystallized. For example, a method using an RTA annealing furnace, a method of performing laser annealing and a method of performing electron beam irradiation may be used.

The IZO film crystallized by the heat treatment is excellent in adhesion with the p-type semiconductor layer 14 and the positive electrode bonding pad 16 as compared with the IZO film in an amorphous state, and thus a decrease in yield caused by peeling in the manufacturing process of the light-emitting device can be prevented. The crystallized IZO film causes less reaction with moisture in air and is excellent in resistance to chemicals such as an acid as compared with the IZO film in an amorphous state, thus causing less deterioration of characteristics in a long-time duration test.

"Negative Electrode"

After the heat treatment of the IZO film, as shown in FIG. 1, the n-type semiconductor layer 12 is exposed by removing a portion of the p-type semiconductor layer 14, the light-emitting layer 13 and the n-type semiconductor layer 12 through etching, and thus a conventionally known negative electrode 17 made of Ti/Al is formed on the exposed n-type semiconductor layer 12. As the negative electrode 17, negative electrodes having various compositions and structures are known, and these known negative electrodes can be used without any limitation.

"Positive Electrode Bonding Pad"

On a portion of the IZO film layer as the positive electrode 15, a positive electrode bonding pad 16 for electrical connection with a circuit board or a lead frame is disposed. As the positive electrode bonding pad 16, those having various structures using materials such as Au, Al, Ni and Cu are known, and those having these known structure using these known materials can be used without any limitation. The thickness of the bonding pad 16 is preferably within a range from 100 to 1,000 nm. In terms of characteristics of the bonding pad, bondability enhances as the thickness increases. Therefore, the thickness of the positive electrode bonding pad 16 is more preferably 300 nm or more. In view of manufacturing cost, the thickness is preferably 500 nm or less.

"Protective Layer"

A protective film is more preferably formed on the IZO film so as to prevent oxidation of the IZO film. This protective film is preferably made of a material having excellent transparency so as to coat the entire range of the IZO film excluding the range where the positive electrode bonding pad is formed. Furthermore, the material has preferably insulating properties so as to prevent leakage between the p-type semiconductor layer and the n-type semiconductor layer. For example, $SiO_2$ and $Al_2O_3$ are preferable. The thickness of the protective layer is preferably a thickness that enables prevention of oxidation of the IZO film and excellent transparency. Specifically, the thickness is preferably from 20 to 500 nm.

"Lamp"

The gallium nitride-based compound semiconductor light-emitting device described above of the present invention can be provided with a transparent cover by means known to those skilled in the art to form a lamp. Also, a white lamp can be formed by using the gallium nitride-based compound semiconductor light-emitting device of the present invention in combination with a cover equipped with a fluorescent material.

The gallium nitride-based compound semiconductor light-emitting device of the present invention can be formed into a LED lamp without any limitation using a conventionally known method. The lamp can be used for any applications, for example, a shell-shaped lamp for general application, a side view-type lamp for backlights of cellular phones, and top view-type lamp for indicators.

Figure 6:
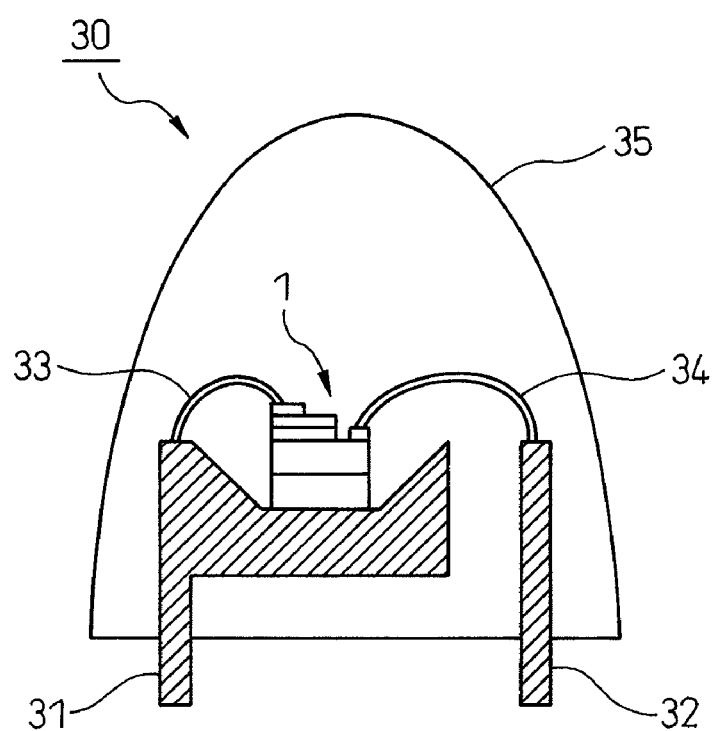
FIG. 6 is a sectional view schematically showing a lamp formed using a gallium nitride-based compound semiconductor light-emitting device of the present invention.

FIG. 6 is a schematic view for explaining one example of a lamp of the present invention. A lamp 30 shown in FIG. 6 is a lamp in which a face-up type gallium nitride-based compound semiconductor light-emitting device of the present invention is packaged in a shell-shaped mold. In the lamp 30 shown in FIG. 6, the gallium nitride-based compound semiconductor light-emitting device 1 shown in FIG. 1 is bonded to one of two frames 31, 32 using a resin, while a positive electrode bonding pad 16 and a negative electrode 17 are respectively bonded to the frames 31, 32 using wires 33, 34 made of a material such as gold. As shown in FIG. 6, a mold 35 made of a transparent resin is formed around the gallium nitride-based compound semiconductor light-emitting device 1.

A lamp manufactured from the gallium nitride-based compound semiconductor light-emitting device of the present invention has high light emission output and low drive voltage. Thus, it is possible to drive at low electric power electronic devices such as cellular phones, displays and panels each comprising the lamp manufactured by this technique incorporated therein; and mechanical devices such as automobiles, computers and games each having the electronic device incorporated therein. Particularly, a power-saving effect can be achieved in battery-driven devices such as cellular phones, game machines, toys and automobile components.

The present invention is not limited to the above embodiments. For example, the semiconductor layer included in the semiconductor light-emitting device of the present invention is not limited to the above gallium nitride-based compound semiconductor layer, and any compound semiconductor layer may be used.

EXAMPLES

The present invention will now be described in detail by way of Test Examples and Examples, but the present invention is not limited to the following Examples.

Test Example 1

Atmosphere in Heat Treatment of IZO Film

A relation between the atmosphere in a heat treatment of an IZO film and sheet resistance of the IZO film after the heat treatment was examined by the following procedure.

An IZO film (250 nm in thickness) in an amorphous state was formed on a glass substrate and the resulting IZO film was heat-treated in an $N_2$ gas atmosphere or a mixed gas atmosphere of $N_2$ containing 25% of $O_2$ at each temperature within a range from 300 to 800° C. In both cases, the sheet resistance was measured. The results are shown in Table 1. The sheet resistance was measured by a measuring device using a 4-probe method (Loresta MP MCP-T360, manufactured by Mitsubishi Chemical Corporation).

TABLE 1

| | Sheet resistance [Ω/sq] | |
|---|---|---|
| Temperature | $O_2$-containing $N_2$ atmosphere | $N_2$ atmosphere |
| 300° C. | 15 | 13 |
| 400° C. | 150 | 13 |
| 500° C. | 200 | 12 |
| 600° C. | $7 \times 10^5$ | 9 |
| 800° C. | $2 \times 10^6$ | 9 |

As is apparent from the results shown in Table 1, the sheet resistance increases as the heat treatment temperature increases when the resulting film is heat-treated in a mixed gas atmosphere of $N_2$ containing $O_2$. It is also apparent that the sheet resistance decreases as the heat treatment temperature increases when the resulting film is heat-treated in an $N_2$ gas atmosphere. The sheet resistance of the IZO film having a thickness of 250 nm before the heat treatment was 15 Ω/sq.

Test Example 2

Heat Treatment Temperature of IZO Film

A relation between the heat treatment temperature of an IZO film and crystallization of the IZO film was examined by the following procedure.

An IZO film (250 nm in thickness) in an amorphous state was formed on a glass substrate and the resulting non-heat-treated IZO film was measured by an X-ray diffraction (XRD) method. The IZO film formed on the glass substrate was heat-treated in an $N_2$ gas atmosphere at each temperature within a range from 300 to 1,000° C. for one minute. The heat-treated IZO film was measured by an X-ray diffraction (XRD) method. The results are shown in FIG. 7.

Figure 7:
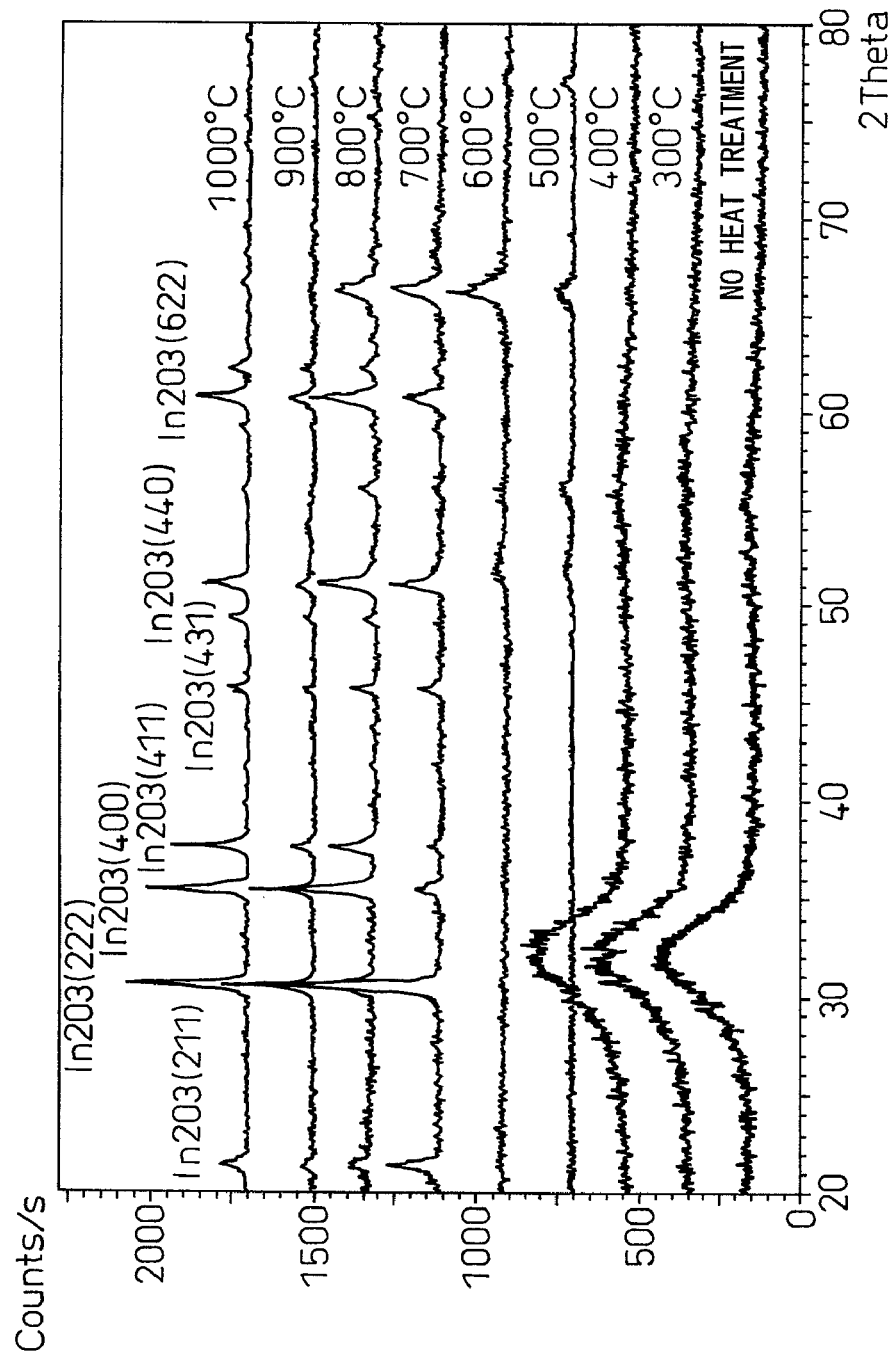
FIG. 7 is a graph showing X-ray diffraction (XRD) results of an IZO film.

FIG. 7 is a graph showing the results of X-ray diffraction (XRD) of the IZO film, in which the abscissa denotes diffraction angle (2θ(°)) while the ordinate denotes X-ray diffraction intensity (s).

In FIG. 7, a broad X-ray peak representing an amorphous state in an IZO film before a heat treatment and an IZO film heat-treated at a temperature of 400° C. or lower is observed. As is apparent from the results, the IZO film before a heat treatment and the IZO film heat-treated at a temperature of 400° C. or lower are in an amorphous state. Also, an X-ray peak attributed to an $In_2O_3$ crystal having a bixbyite structure is observed at the heat treatment temperature of 700° C. or higher and thus it is also apparent that an $In_2O_3$ crystal having a bixbyite structure is present in the IZO film.

Test Example 3

Light Transmittance of IZO Film

The relationship between the heat treatment temperature of an IZO film and the light transmittance of the IZO film was examined by the following procedure.

Figure 8:
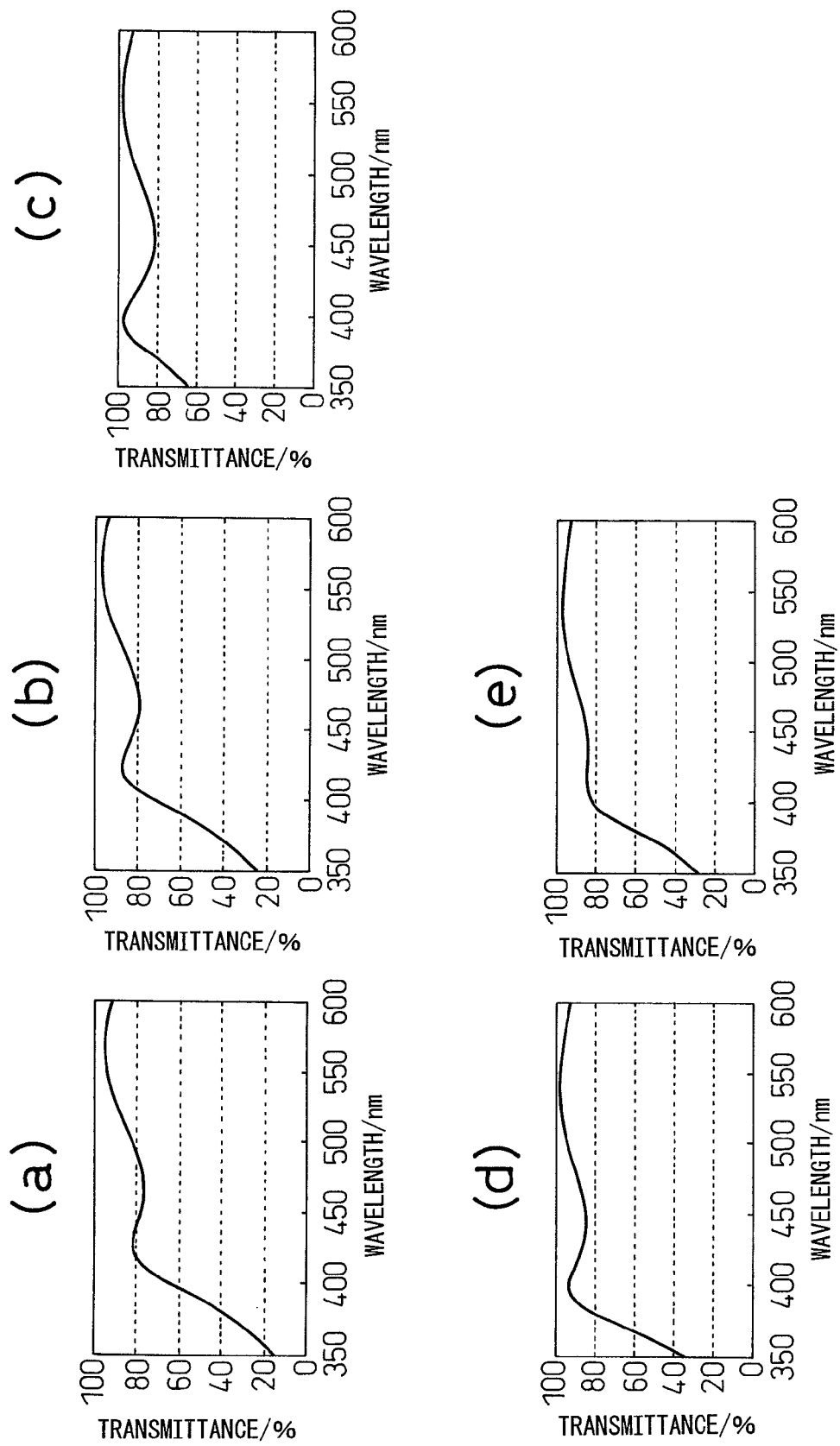
FIG. 8 is a graph showing light transmittance of an IZO film.

Each light transmittance of the non-heat-treated IZO film and the IZO films heat-treated at a temperature of 300° C., 600° C., 800° C. and 1,000° C., which were obtained in Test Example 2, was measured. The results are shown in FIG. 8. In the measurement of the light transmittance of the IZO film, an ultraviolet-visible spectrophotometer UV-2450 manufactured by Shimadzu Corporation was used. The value of the light transmittance was calculated by subtracting only a light transmission blank value obtained by measuring the light transmittance of only the glass substrate.

FIG. 8 shows a graph showing the light transmittance of the IZO film, in which the abscissa denotes wavelength (nm) while the ordinate denotes light transmittance (%). FIG. 8(a), FIG. 8(b), FIG. 8(c), FIG. 8(d) and FIG. 8(e) show the results before a heat treatment, and the results after heat-treated at a temperature of 300° C., 600° C., 800° C. and 1,000° C., respectively.

As is apparent from the results shown in FIG. 8, the light transmittance increases when the IZO film is heat-treated at the temperature of 600° C. or higher as compared with the non-heat-treated IZO film and the IZO film heat-treated at the temperature of 300° C. Particularly, when the IZO film is heat-treated at the temperature of 600° C., the light transmittance is high in an ultraviolet light emitting range of about 400 nm and also, when the IZO film is heat-treated at the temperature of 800° C., the light transmittance is high in a blue light emitting range of about 460 nm. When the IZO film is heat-treated at the temperature of 1,000° C., it is apparent that the light transmittance of the IZO film does not sufficiently increase. Therefore, the heat treatment temperature of the IZO film is particularly preferably 900° C. or lower.

Example 1

Manufacture of Gallium Nitride-Based Compound Semiconductor Light-emitting Device In FIG. 3, a schematic sectional view of a semiconductor wafer comprising a gallium nitride-based compound semiconductor layer manufactured so as to be used in gallium nitride-based compound semiconductor light-emitting device of this example is shown. In FIG. 1 and FIG. 2, a schematic sectional view and a plan view of the gallium nitride-based compound semiconductor light-emitting device manufactured in this example are shown. Description will now be made with reference to these drawings.

A stacked structure of a gallium nitride-based compound semiconductor wafer 20 was formed by sequentially forming, on a substrate 21 made of the c-surface (crystal (0001) face) of sapphire, an undoped GaN underlying layer (2 μm in thickness) 22, a Si-doped n-type GaN contact layer (2 μm in thickness, carrier concentration: $1\times10^{19}$ cm$^{-3}$) 23, a Si-doped n-type $Al_{0.07}Ga_{0.93}N$ clad layer (12.5 nm in thickness, carrier concentration: $1\times10^{18}$ cm$^{-3}$) 24, a light-emitting layer 25 having a multiquantum well structure comprising a six-layered Si-doped GaN barrier layer (14.0 nm in thickness, carrier concentration: $1\times10^{18}$ cm$^{-3}$) and a five-layered undoped $In_{0.20}Ga_{0.80}N$ well layer (2.5 nm in thickness), a Mg-doped p-type $Al_{0.07}Ga_{0.93}N$ clad layer (10 nm in thickness) 26 and a Mg-doped p-type GaN contact layer (100 nm in thickness) 27 through a buffer layer (not shown) made of AlN. The respective constituent layers 22 to 27 of the gallium nitride-based compound semiconductor wafer 20 were grown by general reduced pressure MOCVD means.

Using the gallium nitride-based compound semiconductor wafer 20, a gallium nitride-based compound semiconductor light-emitting device (see FIG. 1) was manufactured. First, the surface of the Mg-doped p-type GaN contact layer 27 of the gallium nitride-based compound semiconductor wafer 20 was washed with HF and HCl, and then an IZO film was formed on the p-type GaN contact layer 27 by a sputtering method. The IZO film was formed in a thickness of about 250 nm by DC magnetron sputtering. An IZO target having a ZnO concentration of 10% by mass was used in sputtering and the IZO film was formed under a pressure of about 0.3 Pa by introducing an Ar gas of 70 sccm.

Sheet resistance of the IZO film formed by the above method was 17 Ω/sq. It could be confirmed by XRD that the IZO film immediately after formation is amorphous.

After formation of the IZO film, the IZO film was formed only in the range where a positive electrode on the p-type GaN contact layer 27 is formed by known photolithography and wet etching. The amorphous IZO film was etched at an etching rate of about 40 nm/min using an ITO-07N etching solution. Thus, the positive electrode (see the symbol 15 in FIG. 1 and FIG. 2) of the present invention was formed on the p-type GaN contact layer 27.

The IZO film was patterned by wet etching and then heat-treated at 800° C. for one minute using an RTA annealing furnace. The heat treatment was performed after replacing the atmosphere in the RTA annealing furnace with an $N_2$ gas atmosphere by purging with an $N_2$ gas several times before temperature rising.

The heat-treated IZO film shows higher light transmittance than that immediately after formation in a wavelength range of 350 to 600 nm, and sheet resistance was 10Ω/sq. In the measurement of XRD after the heat treatment, an X-ray peak attributed to an $In_2O_3$ crystal having a bixbyite structure is mainly detected, and thus it was confirmed that the IZO film is crystallized.

Next, the range where a negative electrode is formed was subjected to normal dry etching, and thus the surface of the Si-doped n-type GaN contact layer was exposed only in this range (see FIG. 1). On a portion of the IZO film layer (positive electrode) and the exposed Si-doped n-type GaN contact layer 23, a first layer (40 nm in thickness) made of Cr, a second layer (100 nm in thickness) made of Ti and a third layer (400 nm in thickness) made of Au were sequentially stacked to form a positive electrode bonding pad 16 and a negative electrode 17, respectively.

After forming the positive electrode bonding pad and the negative electrode, the back surface of a substrate 11 (21) made of sapphire was abraded using abrasive grains of fine diamond particles and then finally mirror-polished. The wafer was cut, separated into square chips measuring 350 μm by 350 μm, placed on a lead frame and then bonded to a lead frame using a gold (Au) wire. (Measurement of Drive Voltage (Vf) and Light Emission Output (Po))

A forward voltage (drive voltage: Vf) at a current applied value of 20 mA of these chips was measured by electrification using a probe needle. Also, light emission output (Po) and emission wavelength were measured by a usual integrating sphere. Regarding light emission distribution, it could be confirmed that light is emitted on the entire surface of the positive electrode 15.

The chips had an emission wavelength at a wavelength range of about 460 nm, Vf was 3.24 V, and Po was 12.6 mW.

Comparative Example 1 and Examples 2 to 4

In the same manner as in Example 1, except that the IZO film was heat-treated at 300° C. (Comparative Example), 500° C., 600° C. and 700° C., gallium nitride-based compound semiconductor light-emitting devices were manufactured, and then evaluated in the same manner as in Example 1.

Figure 9:
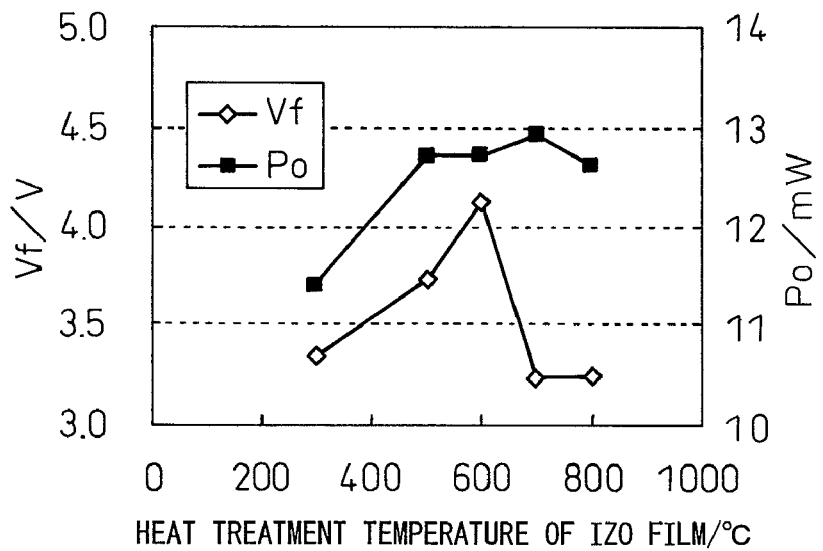
FIG. 9 is a graph showing the relationship between the heat treatment temperature of an IZO film, and the drive voltage and the light emission output of a gallium nitride-based compound semiconductor light-emitting device.

In FIG. 9, a relation between the heat treatment temperature of the IZO film, and Vf and Po of the gallium nitride-based compound semiconductor light-emitting device is shown. The abscissa denotes the heat treatment temperature (° C.) of the IZO film while the ordinate denotes Vf (V) of the gallium nitride-based compound semiconductor light-emitting device and Po (mW) of the gallium nitride-based compound semiconductor light-emitting device.

As is apparent from the results shown in FIG. 9, Po of the gallium nitride-based compound semiconductor light-emitting device increases when the device is heat-treated at the temperature of 500° C. or higher. Also, Vf of the gallium nitride-based compound semiconductor light-emitting device is about 0.1 V lower than that in the case where the device is not heat-treated when the device is heat-treated at the temperature of 700° C. or higher.

Example 5

In the same manner as in Example 1, except that the surface that is not contacted with the p-type semiconductor layer of the IZO film is subjected to uneven working, a gallium nitride-based compound semiconductor light-emitting device was manufactured, and then evaluated in the same manner as in Example 1.

The uneven working step was performed before the heat treatment of the IZO film and wet etching was performed using the ITO-07 etching solution in the same manner as in the case of patterning of the IZO film. The uneven shape is a cylindrical recess shape measuring 2 μm in diameter and 150 nm in depth. Cylindrical recesses were arranged zigzag at a center pitch of 3 μm. Vf of the resulting gallium nitride-based compound semiconductor light-emitting device was 3.23 V, and Po was 13.5 mW.

Examples 6 and 7

In the same manner as in Example 5, except that the depths of the cylindrical recesses were respectively adjusted to 200 nm and 250 nm, gallium nitride-based compound semiconductor light-emitting devices were manufactured, and then evaluated in the same manner as in Example 1.

Figure 10:
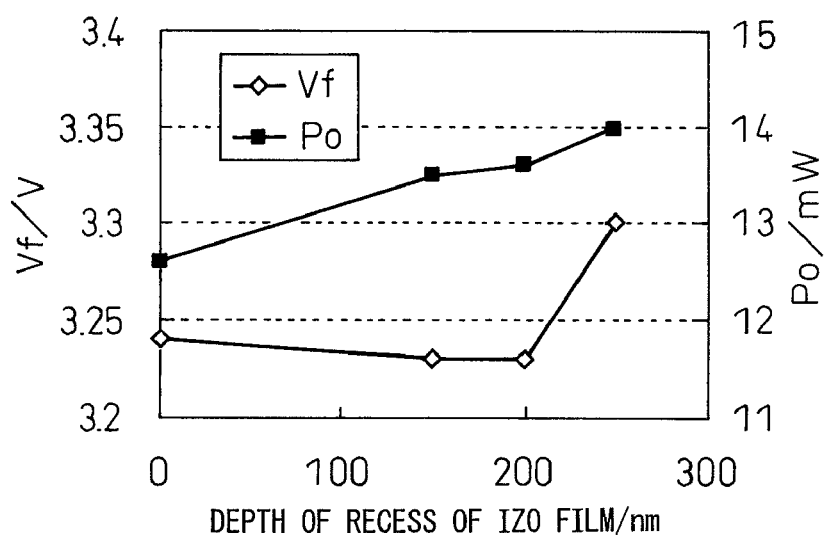
FIG. 10 is a graph showing the relationship between the depth of recesses on the surface of an IZO film, and the drive voltage and the light emission output of a gallium nitride-based compound semiconductor light-emitting device.

In FIG. 10, a relation between the depth of the recesses on the surface of the IZO film, and Vf and Po of the gallium nitride-based compound semiconductor light-emitting device is shown. The abscissa denotes the depth (nm) of the recesses on the surface of the IZO film while the ordinate denotes Vf (V) of the gallium nitride-based compound semiconductor light-emitting device and Po (mW) of the gallium nitride-based compound semiconductor light-emitting device. When the depth of the recesses on the surface of the IZO film is 0, it shows that uneven working is not performed (Example 1).

As is apparent from the results shown in FIG. 10, as the depth of the recesses formed on the surface that is not contacted with the p-type semiconductor layer of the IZO film increases, Po of the gallium nitride-based compound semiconductor light-emitting device increases. When the depth of the recesses is 250 nm, namely, the surface of the p-type semiconductor layer of the gallium nitride-based compound semiconductor light-emitting device is exposed, Vf of the gallium nitride-based compound semiconductor light-emitting device increases.

Comparative Example 2

In the same manner as in Example 1, except that an ITO film was used as the positive electrode 15, a gallium nitride-based compound semiconductor light-emitting device was manufactured.

On a p-type GaN contact layer 27 of a wafer 20, a 250 nm thick ITO film was formed by a sputtering method. In the measurement of XRD after sputtering, an X-ray peak attributed to an $In_2O_3$ crystal having a bixbyite structure was detected, and thus it was confirmed that the ITO film before the heat treatment is crystallized. This ITO film could not be etched with the ITO-07N etching solution used in Example 1. Therefore, the ITO film was formed only in the range where a positive electrode is formed on a p-type GaN contact layer 27 by wet etching with HCl. The ITO film was patterned and then subjected to a heat treatment twice, namely, a heat treatment in a $N_2$ gas atmosphere containing 25% $O_2$ at 600° C. for one minute and a heat treatment in a $N_2$ gas atmosphere at 500° C. for one minute. Sheet resistance of the ITO film after subjecting to the heat treatment twice was 15 Ω/sq.

After subjecting to the heat treatment twice, a gallium nitride-based compound semiconductor light-emitting device was manufactured in the same manner as in Example 1. Vf of the resulting gallium nitride-based compound semiconductor light-emitting device was 3.3 V, and Po was 12.5 mW.

INDUSTRIAL APPLICABILITY

The compound semiconductor light-emitting device of the present invention has high light emission output and low drive voltage, and therefore has industrial utility value as a lamp.

The invention claimed is:

1. A method for manufacturing a compound semiconductor light-emitting device, which comprises steps (a) to (c) shown below:
   (a) a step of manufacturing a semiconductor wafer by stacking an n-type semiconductor layer, a light-emitting layer and a p-type semiconductor layer, that are made of a gallium nitride-based compound semiconductor, on a substrate, the n-type semiconductor layer and the p-type semiconductor layer being stacked so as to interpose the light-emitting layer therebetween,
   (b) a step of stacking an amorphous IZO film on the p-type semiconductor layer, and
   (c) a step of crystallizing the amorphous IZO film, wherein the step of crystallizing the amorphous IZO film is performed by a heat treatment at a temperature of from 700° C. to 900° C. in an $O_2$ free atmosphere.

2. The method for manufacturing a compound semiconductor light-emitting device according to claim 1, wherein the step of stacking an amorphous IZO film on the p-type semiconductor layer is performed by a sputtering method.

3. The method for manufacturing a compound semiconductor light-emitting device according to claim 1, wherein the heat treatment is performed in an $N_2$ gas atmosphere or in a mixed gas atmosphere of $N_2$ and $H_2$.

\* \* \* \* \*